(12) United States Patent
Tsurunari et al.

(10) Patent No.: US 8,368,486 B2
(45) Date of Patent: Feb. 5, 2013

(54) DUPLEXER (75) Inventors: Tetsuya Tsurunari, Osaka (JP); Hiroyuki Nakamura, Osaka (JP); Joji Fujiwara, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/551,853

(22) Filed: Jul. 18, 2012

(65) Prior Publication Data

US 2012/0326801 A1  Dec. 27, 2012

Related U.S. Application Data (62) Division of application No. 12/681,182, filed as application No. PCT/JP2008/002676 on Sep. 26, 2008.

(30) Foreign Application Priority Data

Oct. 1, 2007  (JP) .................................. 2007-257302
Apr. 24, 2008  (JP) .................................. 2008-113564

(51) Int. Cl.
*H03H 9/00* (2006.01)
*H03H 9/25* (2006.01)

(52) U.S. Cl. ........................................ 333/133; 333/193
(58) Field of Classification Search ................... 333/133, 333/193, 194, 195, 196
See application file for complete search history.

(56) References Cited

U.S. PATENT DOCUMENTS 7,038,551 B2    5/2006  Kearns
7,135,944 B2 *  11/2006  Iwamoto et al. ............. 333/133
7,298,231 B2 *  11/2007  Ikuta et al. .................... 333/133
2002/0039056 A1    4/2002  Kawachi et al.
2003/0214369 A1    11/2003  Kearns
2004/0155730 A1    8/2004  Iwamoto et al.
2008/0284540 A1    11/2008  Nishihara et al.
2010/0219901 A1 *  9/2010  Tsurunari et al. ................. 333/4

FOREIGN PATENT DOCUMENTS

| JP | 2000-49565 | 2/2000 |
| JP | 2003-198325 | 7/2003 |
| JP | 2003-249842 | 9/2003 |
| JP | 2003-347964 | 12/2003 |
| JP | 2004-80233 | 3/2004 |

OTHER PUBLICATIONS

International Search Report issued Dec. 16, 2008 in International (PCT) Application No. PCT/JP2008/002676.
Translation of the International Preliminary Report on Patentability issued May 4, 2010 in International (PCT) Application No. PCT/JP2008/002676.

* cited by examiner

*Primary Examiner* — Dean O Takaoka
(74) *Attorney, Agent, or Firm* — Wenderoth, Lind & Ponack, L.L.P.

(57) ABSTRACT

A duplexer includes an acoustic wave element having a first terminal and a second terminal; a substrate; a first columnar conductor electrically connected to the first terminal, and drawn to a back surface of the substrate while partially in the substrate; a second columnar conductor electrically connected to the second terminal, and drawn to the back surface of the substrate while partially in the substrate. Additionally, a first ground pattern region is between the first columnar conductor drawn part and the second columnar conductor drawn part on the back surface of the substrate; a second ground pattern region is electrically connected to the first ground pattern region and arranged in the part not including the part between the first columnar conductor drawn part and the second columnar conductor drawn part; and a third columnar conductor electrically is connected to the first ground pattern region while partially in the substrate.

8 Claims, 7 Drawing Sheets

DUPLEXER

BACKGROUND OF THE INVENTION

This application is a divisional of application Ser. No. 12/681,182, which is the National Stage of International Application No. PCT/JP2008/002676, filed Sep. 26, 2008 and also claims the priority of Japanese Patent Application No. 2007-257302 filed on Oct. 1, 2007 in Japan and Japanese Patent Application No. 2008-113564 filed on Apr. 24, 2008 in Japan, and the contents of which are incorporated herein by references.

1. Technical Field

The present invention relates to a duplexer used in a mobile phone and the like.

2. Background Art

Figure 14:
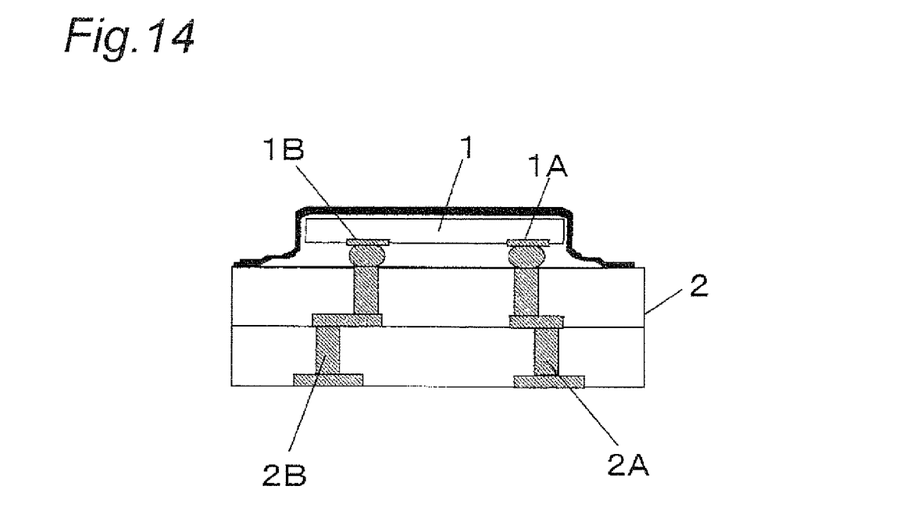
FIG. 14 is a cross-sectional view of a conventional duplexer.

As shown in FIG. 14, conventionally, this kind of duplexer includes an acoustic wave element 1 having an antenna terminal 1A, a reception terminal 1B, and a transmission terminal (not shown), and a ceramic substrate 2 on which the acoustic wave element 1 is set. The substrate 2 internally has a columnar conductor 2A electrically connected to the antenna terminal 1A and drawn to a back surface of the substrate 2, a columnar conductor 2B electrically connected to the reception terminal 1B and drawn to the back surface of the substrate 2, and a columnar conductor (not shown) electrically connected to the transmission terminal (not shown) and drawn to the back surface of the substrate 2. Since a ground pattern is not provided between the drawn part of the columnar conductor 2A and the drawn part of the columnar conductor 2B on the back surface of the substrate 2, a solder and the like prevents a short circuit from generating between the drawn part of the columnar conductor 2A and the drawn part of the columnar conductor 2B.

In addition, Japanese Patent Laid-open Publication No. 2000-49565 is known as a conventional art document information relating to this application.

SUMMARY OF THE INVENTION

The above-described duplexer has had a problem in low isolation.

More specifically, in the above conventional configuration, when electromagnetic field coupling is generated between the drawn part of the columnar conductor 2A and the drawn part of the columnar conductor 2B, for example, a signal is transmitted from the columnar conductor 2A to the columnar conductor 2B due to the electromagnetic field coupling, and as a result, its isolation becomes problematically low.

Thus, it is an object of the present invention to improve isolation of a duplexer.

Thus, in order to achieve the above object, the present invention provides a configuration having a first ground pattern region arranged between a first columnar conductor drawn part and a second columnar conductor drawn part on a back surface of a substrate, a second ground pattern region electrically connected to the first ground pattern region on the back surface of the substrate, and arranged in a part not including between the first columnar conductor drawn part and the second columnar conductor drawn part, a third columnar conductor electrically connected to the first ground pattern region, while being buried partially in the substrate, and an insulating coating formed on a surface to which the first ground pattern region is exposed.

In the above configuration, the insulation coating prevents a short circuit from generating between the first columnar conductor drawn part and the second columnar conductor drawn part, and the third columnar conductor electrically connected to the second ground pattern region through the first ground pattern region prevents electromagnetic field coupling from generating between the first columnar conductor and the second columnar conductor, and as a result, isolation of the duplexer can be improved.

BRIEF DESCRIPTION OF THE DRAWINGS

The present invention will become readily understood from the following description of preferred embodiments thereof made with reference to the accompanying drawings, in which like parts are designated by like reference numeral and in which.

EXPLANATION OF REFERENCES

4 ACOUSTIC WAVE ELEMENT
4A FIRST TERMINAL (ANTENNA TERMINAL)
4B SECOND TERMINAL (RECEPTION TERMINAL)
5 SUBSTRATE
5A FIRST COLUMNAR CONDUCTOR
5B SECOND COLUMNAR CONDUCTOR
5C THIRD COLUMNAR CONDUCTOR
6A FIRST COLUMNAR CONDUCTOR DRAWN PART
6B SECOND COLUMNAR CONDUCTOR DRAWN PART
7 INSULATING COATING
8A FIRST GROUND PATTERN REGION
8B SECOND GROUND PATTERN REGION

DETAILED DESCRIPTION OF THE PREFERRED EMBODIMENTS

First Embodiment

Hereinafter, a duplexer according to a first embodiment of the present invention will be described with reference to the drawings.

Figure 1:
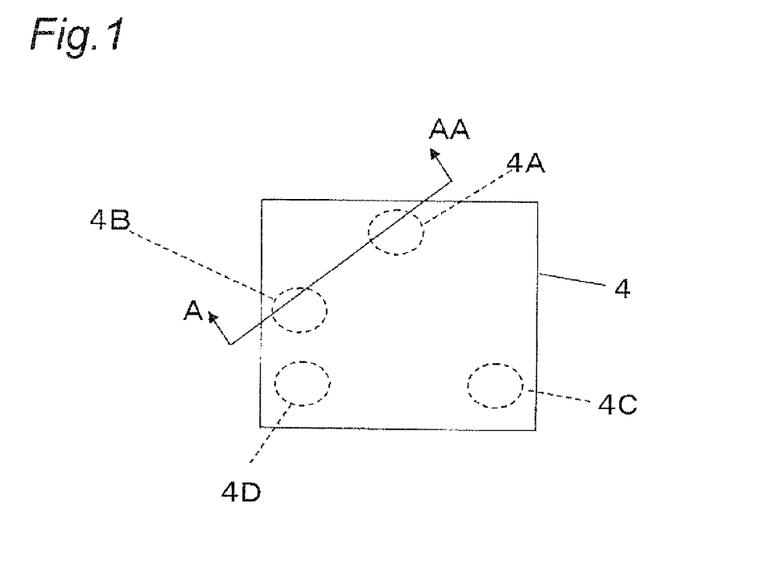
FIG. 1 is a top view of an acoustic wave element in a duplexer according to a first embodiment of the present invention.
Figure 2:
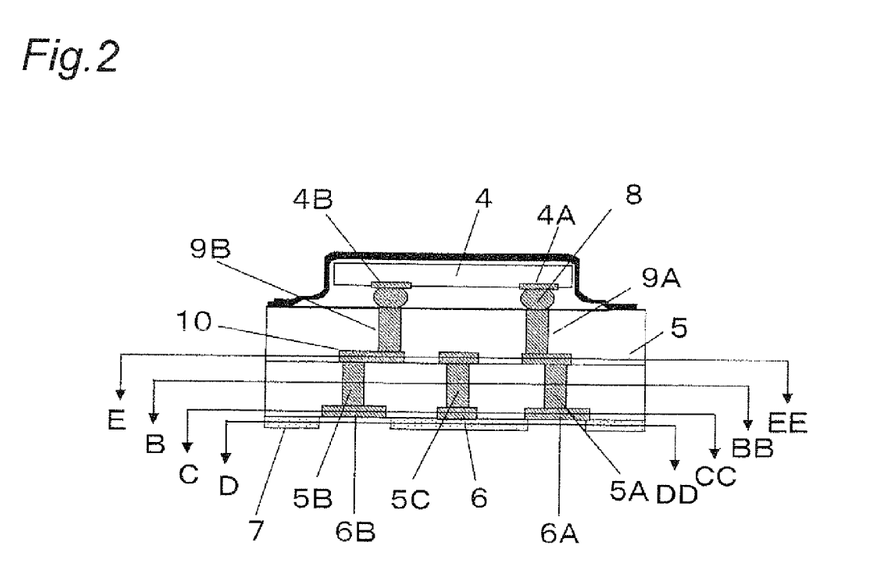
FIG. 2 is a cross-sectional view of the duplexer according to the first embodiment of the present invention.

As shown in FIG. 1, the duplexer according to this embodiment includes an acoustic wave element 4 having an antenna terminal 4A serving as a first terminal, reception terminals 4B and 4D serving as second terminals, and a transmission terminal 4C on its lower side and as shown in FIG. 2, a substrate 5 on which the acoustic wave element 4 is set. In addition, the duplexer according to this first embodiment outputs reception signals as a balanced output with the reception terminals 4B and 4D. Here, FIG. 2 is a cross-sectional view showing the whole duplexer taken along a line A-AA in FIG. 1.

Figure 3:
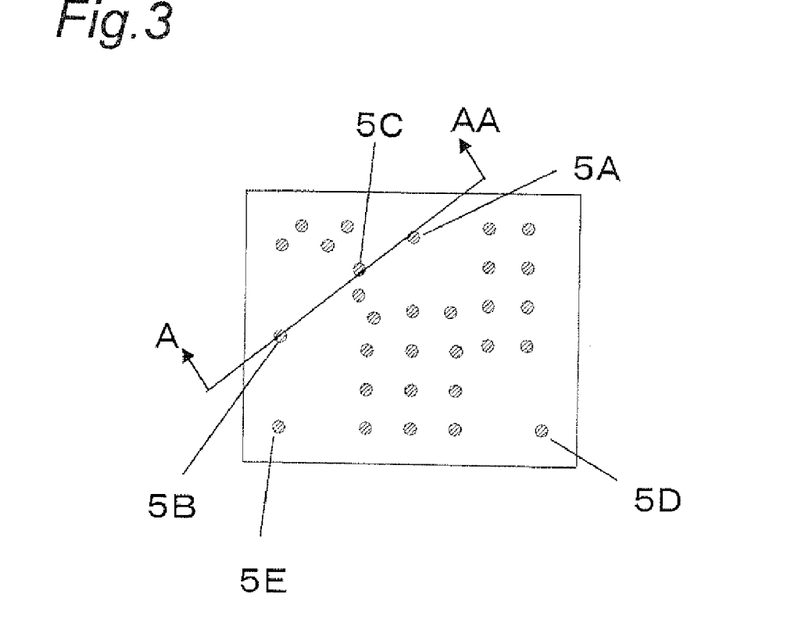
FIG. 3 is a cross-sectional view taken along a line B-BB in FIG. 2.

Thus, the substrate 5 internally has a first columnar (pillar or via) conductor 5A having at least one embedded part therein, electrically connected to the antenna terminal 4A, and drawn to a back surface of the substrate 5, and a second columnar conductor 5B and a fifth columnar conductor 5E electrically connected to the reception terminals 4B and 4D respectively, while each being partially buried in the substrate 5, and drawn to the back surface of the substrate 5 similarly. A cross sectional view taken along a line B-BB in FIG. 2 is shown in FIG. 3, and a cross section taken along a line A-AA in FIG. 3 corresponds to FIG. 2.

Figure 4:
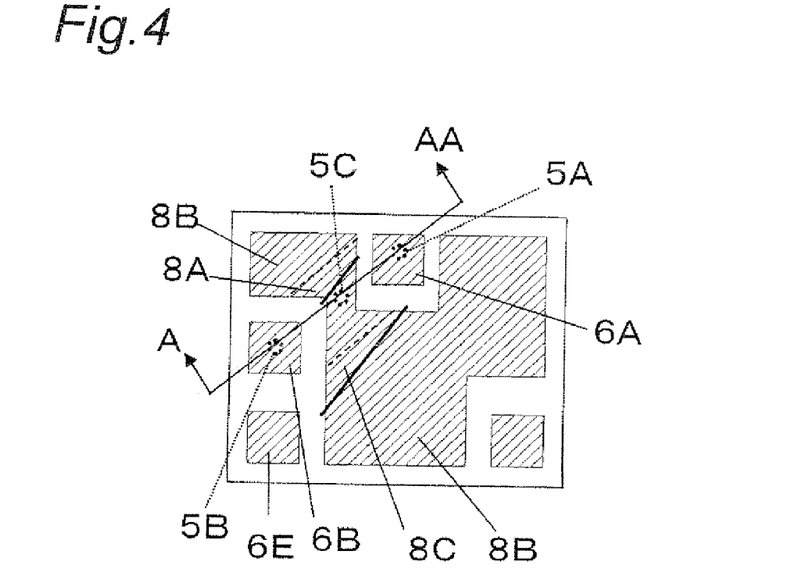
FIG. 4 is a cross-sectional view taken along a line C-CC in FIG. 2.

Thus, as shown in FIG. 4 as a cross-sectional view taken along a line C-CC in FIG. 2, the back surface of the substrate 5 includes a first ground pattern region 8A arranged in a region sandwiched by two dotted lines which are parallel to a straight line connecting the drawn part of the first columnar conductor 5A and the drawn part of the second columnar conductor 5B, and a second ground pattern region 8B electrically connected to the first ground pattern region 8A, and arranged in the region not including the region sandwiched by the above two dotted lines between the drawn part of the first columnar conductor 5A and the drawn part of the second columnar conductor 5B.

Thus, a third columnar conductor 5C is formed so as to be electrically connected to the first ground pattern region 8A as shown in FIG. 4, and embedded in the substrate 5 as shown in FIG. 2. In this configuration, the third columnar conductor 5C is at roughly the ground potential.

Figure 5:
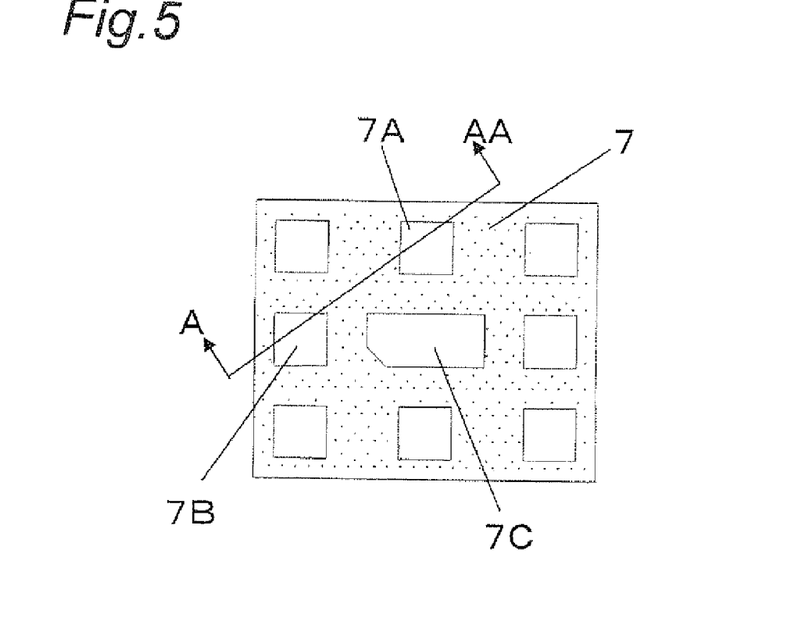
FIG. 5 is a cross-sectional view taken along a line D-DD in FIG. 2.
Figure 6:
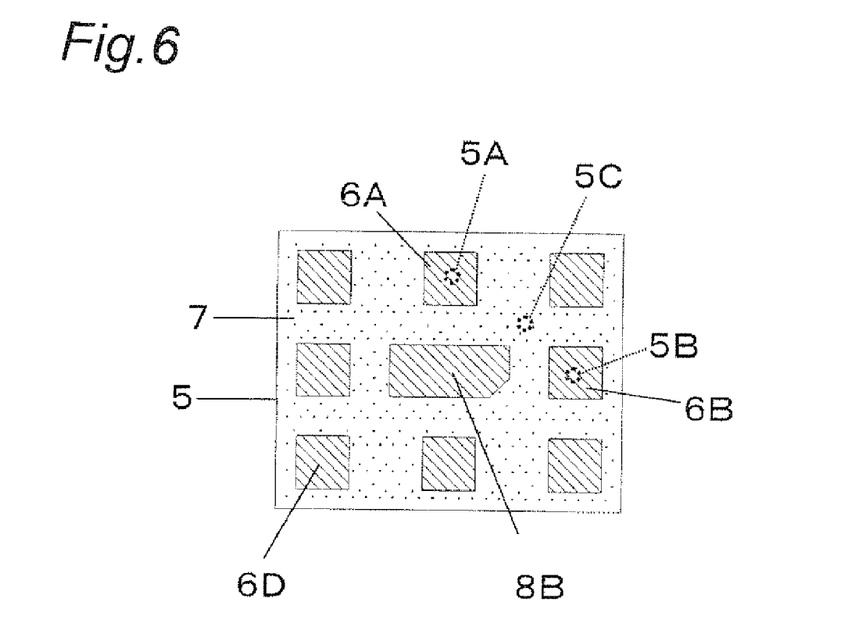
FIG. 6 is a bottom view of the duplexer according to the first embodiment of the present invention.

Thus, an insulation coating 7 is provided on a surface to which the first ground pattern region 8A is exposed as shown in FIG. 5 as a sectional view taken along a line D-DD in FIG. 2. A first columnar conductor drawn part 6A, a second columnar conductor drawn part 6B, and the second ground pattern region 8B are exposed from parts 7A, 7B, and 7C, respectively, in which the insulating coating is not provided, as shown in FIG. 6 as a bottom view of the duplexer shown in FIG. 2. In addition, a fifth columnar conductor drawn part 6E electrically connected to the reception terminal 4D through the fifth columnar conductor 5E is also exposed. In other words, the duplexer outputs the reception signals as a balanced output with the second columnar conductor drawn part 6B and the fifth columnar conductor drawn part 6E.

In addition, since FIG. 6 is a bottom view, it is a mirror-reversed view of FIG. 5 as the cross-sectional view taken from the top of the duplexer.

In addition, the transmission terminal 4C shown in FIG. 1 is electrically connected to a columnar conductor 5D shown in FIG. 3, in the substrate 5 shown in FIG. 2, and as shown in FIG. 6, its drawn part 6D is exposed from the part in which the insulation coating 7 is not formed in the back surface of the substrate 5.

Thus, as shown in FIG. 6, the insulation coating 7 prevents a short circuit from generating between the first columnar conductor drawn part 6A and the second columnar conductor drawn part 6B, and as shown in FIG. 4, the third columnar conductor 5C electrically connected to the second ground pattern region 8B through the first ground pattern region 8A prevents electromagnetic field coupling from generating between the first columnar conductor 5A and the second columnar conductor 5B. As a result, the isolation of the duplexer can be improved.

More specifically, when the second columnar conductor drawn part 6B and the fifth columnar conductor drawn part 6E which output the reception signal as the balanced outputs are different in distance to the first columnar conductor drawn part 6A electrically connected to the antenna terminal 4A, a coupling degree between the second columnar conductor drawn part 6B and the first columnar conductor drawn part 6A is different from a coupling degree between the fifth columnar conductor drawn part 6E and the first columnar conductor drawn part 6A, so that the balance properties of the reception signals outputted from the columnar conductor drawn parts 6B and 6E deteriorate.

Thus, the third columnar conductor 5C electrically connected to the first ground pattern region 8A prevents the electromagnetic field coupling from generating between the first columnar conductor 5A and the second columnar conductor 5B, and as a result, the balance properties of the reception signals outputted from the columnar conductor drawn parts 6B and 6E can be improved. Thus, attenuation properties in a transmission band can be improved.

In addition, by setting a density of the columnar conductor electrically connected to the first ground pattern region 8A higher than a density of the columnar conductor electrically connected to the second ground pattern region, the balance properties of the reception signals outputted from the columnar conductor drawn parts 6B and 6E can be also improved. Thus, the attenuation properties in the transmission band can be improved.

Moreover, by setting the density of the columnar conductor electrically connected to the first ground pattern region 8A higher than a density of a columnar conductor electrically connected to a fourth ground pattern region 8C arranged in a region sandwiched by two thick lines which are parallel to the straight line connecting between the drawn part of the first columnar conductor 5A and the fifth columnar conductor 5E on the back surface of the substrate, the balance properties of the reception signals outputted from the columnar conductor drawn parts 6B and 6E (FIG. 4) can be further improved (FIG. 4). Thus, the attenuation properties in the transmission band can be further improved. In addition, as shown in FIG. 4, the first ground pattern region 8A and the fourth ground pattern region 8C are partially overlapped.

Still furthermore, by setting the number of the columnar conductors electrically connected to the first ground pattern region 8A greater than the number of the columnar conductors electrically connected to the fourth ground pattern region 8C, the balance properties of the reception signals outputted from the columnar conductor drawn parts 6B and 6E can be improved. As a result, the attenuation properties in the transmission band can be further improved.

Figure 7:
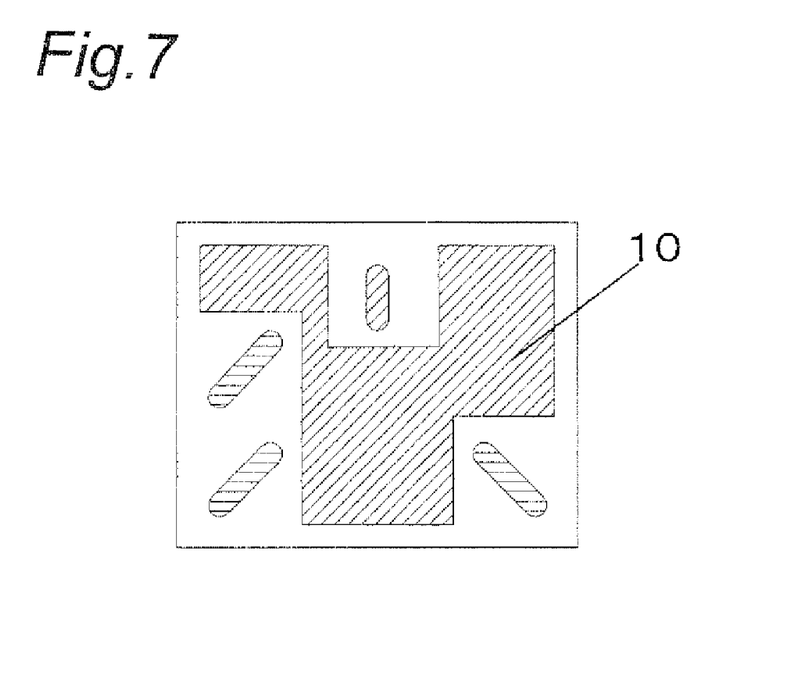
FIG. 7 is a cross-sectional view taken along a line E-EE in FIG. 2.

In addition, according to this embodiment, as shown in FIG. 2, the antenna terminal 4A and the reception terminal 4B are electrically connected to the first and second columnar conductors 5A and 5B, respectively through solder bumps 8, columnar conductors 9A and 9B and an electrode pattern 10 shown in FIG. 7 as a cross-sectional view taken along a line E-EE in FIG. 2. Thus, when the electrode pattern 10 is interposed in the substrate 5, the positions of the first columnar conductor drawn part 6A and the second columnar conductor drawn part 6B are not limited to the positions of the antenna terminal 4A and the transmission terminal 4B in the acoustic wave element, so that a degree of design freedom is enhanced.

Figure 8:
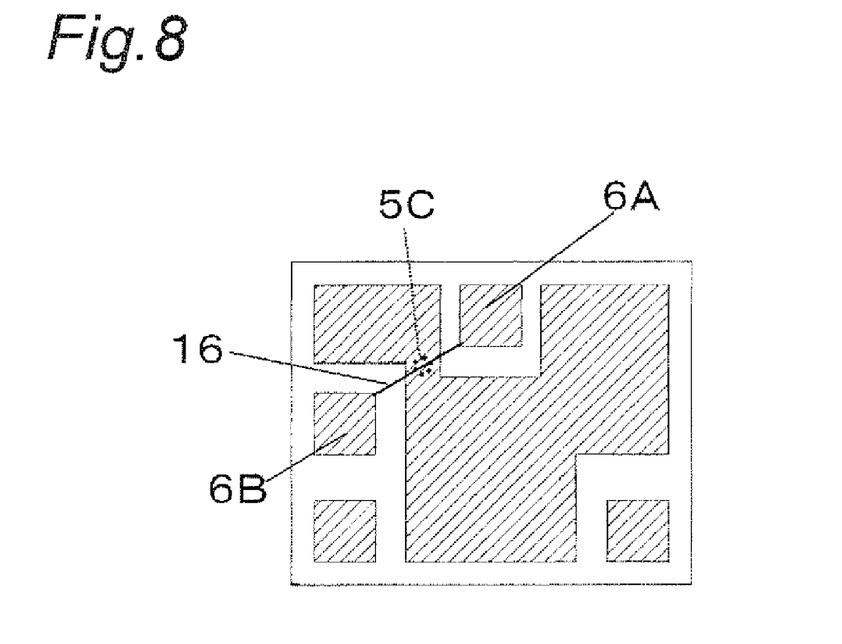
FIG. 8 is a cross-sectional view taken along a line C-CC in FIG. 2.

In addition, according to this embodiment, as shown in FIG. 8, the third columnar conductor 5C is electrically connected to a shortest line segment 16 connecting the first columnar conductor drawn part 6A and the second columnar conductor drawn part 6B in the first ground pattern region 8A. In this configuration, the electromagnetic field coupling can be more effectively prevented from generating between the first columnar conductor drawn part 6A and the second columnar conductor drawn part 6B, and as a result, the isolation of the duplexer can be efficiently improved.

Figure 9:
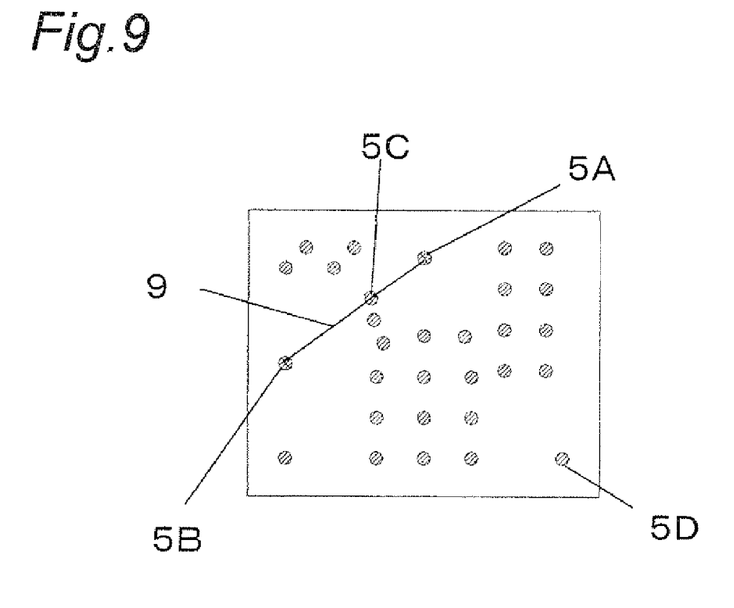
FIG. 9 is a cross-sectional view taken along a line B-BB in FIG. 2.

Furthermore, as shown in FIG. 9, it is desirable that the third columnar conductor 5C is arranged in a plane 9 containing the first columnar conductor 5A and the second columnar conductor 5B because the electromagnetic field coupling can be more effectively prevented from generating between the first columnar conductor 5A and the second columnar conductor 5B, and as a result, the isolation of the duplexer can be improved. In addition, when the second columnar conductor drawn part 6B and the fifth columnar conductor drawn part 6E which output the reception signals as the balanced output are different in distance to the first columnar conductor drawn part 6A electrically connected to the antenna terminal 4A, this configuration can improve the balance properties of the reception signals outputted from the columnar conductor drawn parts 6B and 6E. As a result, the attenuation properties in the transmission band can be improved.

In addition, a description will be made of a problem arising in a case where the duplexer has a function to output a balanced signal, that is, in a case where the reception terminal 4B shown in FIG. 2 is a first balanced output terminal, the acoustic wave element has a second balanced output terminal (not shown) as a third terminal, and a fourth columnar conductor (not shown) having at least one part embedded in the substrate 5, electrically connected to the second balanced output terminal (not shown), and drawn to the back surface of the substrate 5 is provided. In the above case, since both of the second columnar conductor drawn part 6B and the fourth columnar conductor drawn part (not shown) are exposed onto the back surface of the substrate 5 having a limited area, either one of the second columnar conductor drawn part 6B and the fourth columnar conductor drawn part (not shown) is inevitably close to the first columnar conductor drawn part 6A shown in FIG. 6, so that there is concern that the isolation could be lowered. In this case, as shown in FIG. 4 in the above embodiment, the third columnar conductor 5C electrically connected to the second ground pattern region 8B through the first ground pattern region 8A can prevent the electromagnetic field coupling from generating between the first columnar conductor 5A and the second columnar conductor 5B, and as a result, the isolation of the duplexer can be improved.

Furthermore, as described above, when the acoustic wave element has the first and second balanced output terminals (not shown), a desirable effect can be produced when the drawn parts (not shown) of them on the back surface of the substrate 5 are arranged on the same one side in the back surface of the substrate 5 because a connection wiring with another component can be facilitated on a module substrate (not shown) mounting this duplexer.

Figure 10:
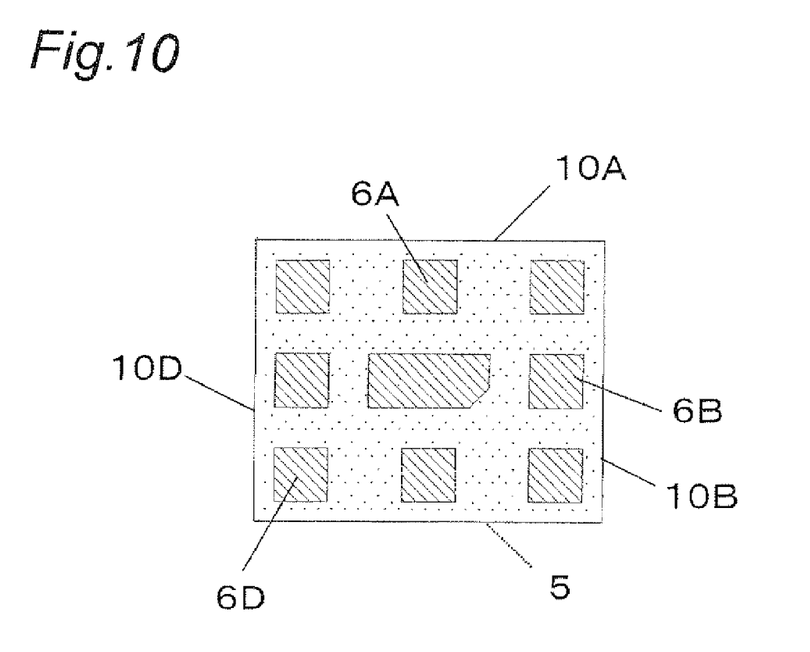
FIG. 10 is a bottom view of the duplexer according to the first embodiment of the present invention.

In addition, as shown in FIG. 10, the first columnar conductor drawn part 6A electrically connected to the antenna terminal 4A (refer to FIGS. 1 and 2) is arranged in the center of a first side 10A. In addition, the drawn part 6B of the second columnar conductor 5B electrically connected to the reception terminal 4B (refer to FIGS. 1 and 2) is arranged on a second side 10B roughly perpendicular to the first side 10A in the substrate 5. Furthermore, the drawn part 6D of the fourth columnar conductor (not shown) electrically connected to the transmission terminal 4C (refer to FIG. 1) is arranged on a third side 10D roughly perpendicular to the first side 10A in the substrate 5. In the above configuration, the electromagnetic field coupling can be prevented from generating between the antenna terminal 4A (refer to FIGS. 1 and 2) and the reception terminal 4B (refer to FIGS. 1 and 2), and between the antenna terminal 4A (refer to FIGS. 1 and 2) and the transmission terminal 4C (refer to FIG. 1) and the isolation of the duplexer can be improved.

Figure 11:
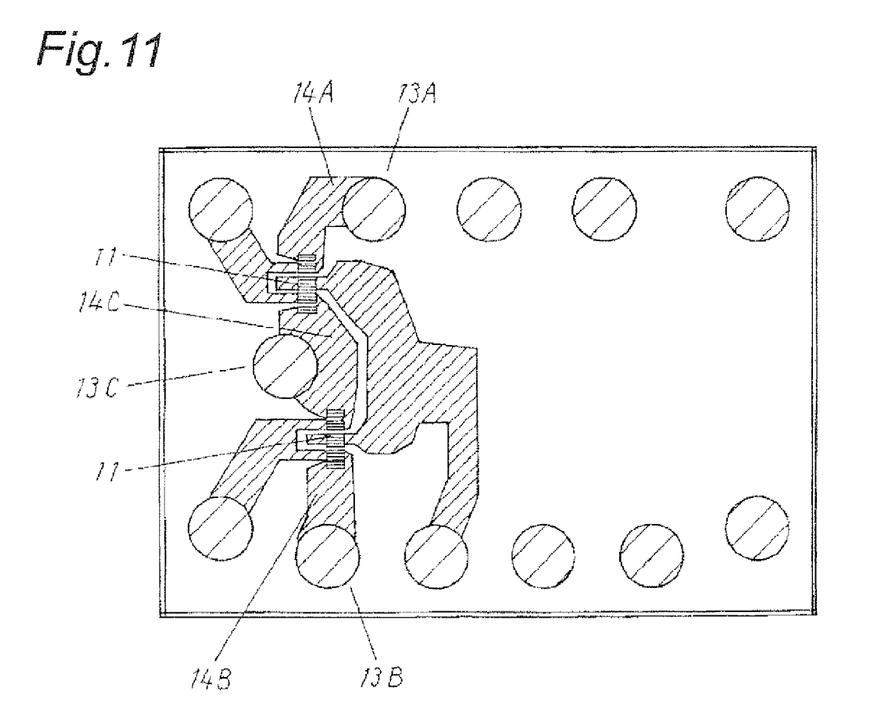
FIG. 11 is a bottom view of the acoustic wave element of the duplexer according to the first embodiment of the present invention.
Figure 12:
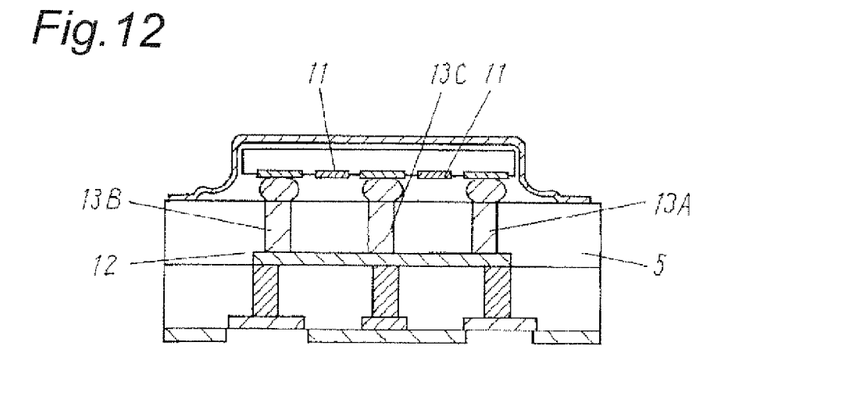
FIG. 12 is a cross-sectional view showing another embodiment of the duplexer according to the first embodiment of the present invention.

Furthermore, as shown in FIG. 11 as a bottom view of the acoustic wave element 4, when the acoustic wave element includes a DMS (double-mode surface acoustic wave) filter 11, as shown in FIG. 12, it is preferable that a third ground pattern 12 is formed in the substrate 5, and fifth columnar conductors 13A and 13B electrically connected to fourth ground patterns 14A and 14B of the DMS filter 11 shown in FIG. 11 are electrically connected to the third ground pattern 12.

Figure 13:
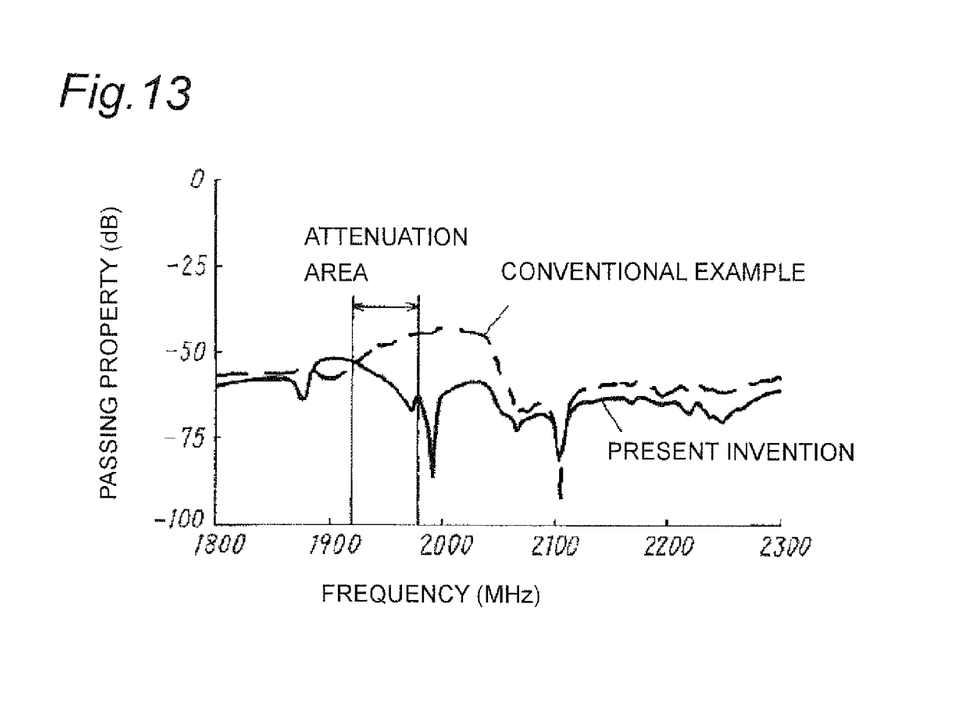
FIG. 13 is a frequency property diagram of the duplexer according to the first embodiment of the present invention.

In the above configuration, a parasitic component interposed between the DMS filter 11 and the ground potential can be prevented from generating, and as a result, common mode properties can be improved as shown in FIG. 13.

In addition, when two or more DMS filters are connected, as shown in FIG. 11, by connecting a fifth columnar conductor 13C electrically connected to a fourth ground pattern 14C formed between the two DMS filters, to the third ground pattern 12, the above effect can be further improved.

A duplexer according to the present invention produces an effect that isolation can be improved, and can be useful in various electronic devices such as a mobile phone and the like.

The invention claimed is:

1. A duplexer comprising:
    an acoustic wave element having an antenna terminal and two balanced output reception terminals, and a transmission terminal;
    a substrate mounting the acoustic wave element on the surface;
    a first columnar conductor electrically connected to the antenna terminal and drawn to a back surface of the substrate;
    a second columnar conductor electrically connected to one of the reception terminals, and drawn to the back surface of the substrate, while being buried partially in the substrate;
    a fourth columnar conductor electrically connected to the other of the reception terminals, and drawn to the back surface of the substrate, while being buried partially in the substrate;
    a first ground pattern region arranged between the first columnar conductor drawn part and the second columnar conductor drawn part, on the back surface of the substrate; and
    a second ground pattern region electrically connected to the first ground pattern region and arranged in the part not including the part between the first columnar conductor drawn part and the second columnar conductor drawn part, on the back surface of the substrate,
    wherein if the second columnar conductor drawn part and the fourth columnar conductor drawn part are different in distance to the first columnar conductor drawn part, a density of a columnar conductor electrically connected to the first ground pattern region is set higher than a density of a columnar conductor electrically connected to the second ground pattern region.

2. A duplexer comprising:
- an acoustic wave element having an antenna terminal and two balanced output reception terminals, and a transmission terminal;
- a substrate having the acoustic wave element set thereon;
- a first columnar conductor electrically connected to the antenna terminal and drawn to a back surface of the substrate;
- a second columnar conductor electrically connected to one of the reception terminals, and drawn to the back surface of the substrate, while being buried partially in the substrate; and
- a fourth columnar conductor electrically connected to the other of the reception terminals, and drawn to the back surface of the substrate, while being buried partially in the substrate;
- a first ground pattern region arranged between the first columnar conductor drawn part and the second columnar conductor drawn part on the back surface of the substrate, and
- a fourth ground pattern region arranged between the first columnar conductor drawn part and the fourth columnar conductor drawn part on the back surface of the substrate,
- wherein if the second columnar conductor drawn part and the fourth columnar conductor drawn part are different in distance to the first columnar conductor drawn part, a density of a columnar conductor electrically connected to the first ground pattern region is set higher than a density of a columnar conductor electrically connected to the fourth ground pattern region.

3. The duplexer according to claim 1, further comprising an insulating coating formed on a surface having the exposed first ground pattern region.

4. The duplexer according to claim 1, wherein the first columnar conductor drawn part is arranged in roughly the center of a first side in the substrate,
- the second columnar conductor drawn part is arranged on a second side roughly perpendicular to the first side in the substrate, and
- the fourth columnar conductor drawn part is arranged on a third side roughly perpendicular to the first side in the substrate.

5. The duplexer according to claim 1, wherein the acoustic wave element has a DMS filter,
- wherein a fifth columnar conductor is electrically connected to a ground pattern in the DMS filter, and a third ground pattern region electrically connected to the fifth columnar conductor is provided in the substrate.

6. The duplexer according to claim 2, further comprising an insulating coating formed on a surface having the exposed first ground pattern region.

7. The duplexer according to claim 2, wherein the first columnar conductor drawn part is arranged in roughly the center of a first side in the substrate,
- the second columnar conductor drawn part is arranged on a second side roughly perpendicular to the first side in the substrate, and
- the fourth columnar conductor drawn part is arranged on a third side roughly perpendicular to the first side in the substrate.

8. The duplexer according to claim 2, wherein the acoustic wave element has a DMS filter,
- wherein a fifth columnar conductor is electrically connected to a ground pattern in the DMS filter, and a third ground pattern region electrically connected to the fifth columnar conductor is provided in the substrate.

* * * * *